(12) United States Patent
Hackenberger et al.

(10) Patent No.: US 7,741,227 B2
(45) Date of Patent: Jun. 22, 2010

(54) PROCESS FOR STRUCTURING AT LEAST ONE YEAR AS WELL AS ELECTRICAL COMPONENT WITH STRUCTURES FROM THE LAYER

(75) Inventors: Maja Hackenberger, Nittendorf (DE); Johannes Voelkl, Erlangen (DE); Roland Zeisel, Tegernheim (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/599,949

(22) PCT Filed: Apr. 21, 2005

(86) PCT No.: PCT/DE2005/000736

§ 371 (c)(1),
(2), (4) Date: Jul. 16, 2007

(87) PCT Pub. No.: WO2005/103818

PCT Pub. Date: Nov. 3, 2005

(65) Prior Publication Data

US 2008/0001162 A1 Jan. 3, 2008

(30) Foreign Application Priority Data

Apr. 22, 2004 (DE) .................... 10 2004 019 588

(51) Int. Cl.
*H01L 21/302* (2006.01)
*H01L 21/461* (2006.01)
*H01L 23/40* (2006.01)
*H01L 23/28* (2006.01)

(52) U.S. Cl. ............. 438/736; 438/739; 257/416; 257/798; 257/E29.001; 257/E21.486; 257/E21.59

(58) Field of Classification Search ............... 438/738, 438/739, 742, 736; 257/E21.486, E21.59, 257/E21.591, E21.143, E21.111, E21.112, 257/E21.483, E21.739, 416, 742, 744, 739, 257/798, E29.001, E21.489
See application file for complete search history.

(56) References Cited

U.S. PATENT DOCUMENTS 4,650,543 A * 3/1987 Kishita et al. ............... 438/573

(Continued)

FOREIGN PATENT DOCUMENTS

| CN | 1378705 | 11/2002 |
|---|---|---|
| DE | 100 54 886.5 | 5/2002 |
| DE | 101 05 163 A1 | 5/2002 |

OTHER PUBLICATIONS

International Preliminary Report on Patentability and Written Opinion of the International Search Authority, International Application Serial No. PCT/DE2005/000736, Nov. 1, 2006, 7 pp.
International Search Report and Written Opinion, International Application Serial No. PCT/DE2005/000736, Dec. 21, 2005, 9 pp.

*Primary Examiner*—Caridad M Everhart
(74) *Attorney, Agent, or Firm*—Fish & Richardson P.C.

(57) ABSTRACT

A process for structuring at least one layer as well as an electrical component with structures from the layer are described.

The invention states a process to generate at least one structured layer (10A), wherein a mask structure (20) with a first (20A) and second structure (20B) is generated on a layer (10) which is present on a substrate (5). Through this mask structure (20), the first layer (20A) is transferred onto the layer (10) using isotropic structuring processes, and the second structure (20B) is transferred onto the layer (10) using anisotropic structuring processes. The process as per the invention permits the generation of two structures (20A, 20B) in at least a single layer while using a single mask structure.

20 Claims, 3 Drawing Sheets

U.S. PATENT DOCUMENTS

| | | | |
|---|---|---|---|
| 4,863,560 A | 9/1989 | Hawkins | |
| 5,096,535 A | 3/1992 | Hawkins et al. | |
| 5,177,439 A * | 1/1993 | Liu et al. | 324/754 |
| 5,225,372 A | 7/1993 | Savkar et al. | |
| 5,420,078 A * | 5/1995 | Sikora | 438/618 |
| 5,431,770 A * | 7/1995 | Lee et al. | 438/592 |
| 5,445,994 A * | 8/1995 | Gilton | 438/612 |
| 5,527,734 A * | 6/1996 | van der Putten | 438/613 |
| 5,686,356 A * | 11/1997 | Jain et al. | 438/624 |
| 5,894,161 A * | 4/1999 | Akram et al. | 257/48 |
| 6,194,235 B1 * | 2/2001 | Ma | 438/14 |
| 6,437,451 B2 * | 8/2002 | Farnworth et al. | 257/780 |
| 6,468,439 B1 * | 10/2002 | Whitehurst et al. | 216/95 |
| 6,627,096 B2 * | 9/2003 | Sherrer et al. | 216/24 |
| 6,672,876 B1 * | 1/2004 | Takekoshi | 439/66 |
| 6,803,327 B1 * | 10/2004 | Cheu et al. | 438/781 |
| 6,828,230 B2 * | 12/2004 | Schoenfeld et al. | 438/643 |
| 6,948,940 B2 * | 9/2005 | Lindsey et al. | 439/66 |
| 7,005,751 B2 * | 2/2006 | Khandros et al. | 257/780 |
| 7,131,848 B2 * | 11/2006 | Lindsey et al. | 439/66 |
| 7,208,399 B2 | 4/2007 | Chu et al. | |
| 7,358,195 B2 * | 4/2008 | Choi et al. | 438/745 |
| 2002/0175381 A1 | 11/2002 | Choi et al. | |
| 2004/0004284 A1 | 1/2004 | Lee et al. | |
| 2009/0146322 A1 * | 6/2009 | Weling et al. | 257/786 |
| 2009/0163030 A1 * | 6/2009 | Omura et al. | 438/703 |

* cited by examiner

PROCESS FOR STRUCTURING AT LEAST ONE YEAR AS WELL AS ELECTRICAL COMPONENT WITH STRUCTURES FROM THE LAYER

BACKGROUND

A process for structuring at least one layer as well as an electrical component with structures from the layer are described.

In the production of semiconductor structures and electrical components, it is frequently necessary to structure at least two structures in one layer. Frequently, a separate photoresist is applied onto the layer for each structure being produced. It is exposed, developed and then the structure of the photoresist is transferred into the layer. Such procedures are time intensive and complicated, since they require the separate application of two photoresist layers as well as the separate structuring of the first and second structures out of at least one layer.

SUMMARY

The task of this invention is to state a process which is improved with regard to the disadvantages described above.

The invention solves this task through a procedure as per claim 1. Example designs of the procedure as well as a component with structures produced using this method are the objects of further claims.

The invention describes processes to produce a structured layer with the following process steps:
A) at least one layer is arranged on a substrate,
B) on the one layer (at least), a mask structure with a first and second structure is produced,
C) the single layer is structured using an isotropic process,
D) the single layer is then structured using an anisotropic process.

Unlike the above described customary procedures, the process in the invention requires only one mask structure, since process steps C) and D) structure the layer in the invention by means of the first and second structures of the mask structure through isotopic and then anisotropic processes. In isotropic structuring procedures, the structuring rate is direction independent, for example as in isotropic etching with wet chemical etching agents. Due to the isotropic structuring, large areas of the single layer are removed under the first structure in process step C), so that the underlying areas of this layer are then accessible for structuring in process step D). In the anisotropic procedures, the structuring rate is direction dependent. Possible isotropic structuring methods in process step C) include, for instance, wet chemical etching methods, and possible anisotropic structuring methods in process step D) include, for instance, sputter processes. Further examples of isotropically-acting etching agents are wet chemical etching media such as HF and HCl solutions. Examples of anisotropic etching agents are, for instance, argon or chloride plasma. It is therefore possible as per the invention to use the combination of isotropic structuring methods in process step C) and anisotropic structuring methods in process step D) to generate two structures in at least one layer with only one mask structure.

In an advantageous embodiment, a first layer is produced in process step A), and then at least a second layer is generated above it, with the second layer being structured in C), and the first layer being structured in D).

Due to the isotropic structure in process step C), large areas of the second layer are removed in process step C) below the second structure of the mask structure, so that larger areas of the first layer are uncovered and are then accessible for structuring in process step D). Thereafter, the second structure of the mask structure is transferred into the first layer as precisely as possible in process step D), using an anisotropic structuring process.

Favorably, the first structure of the mask structure is transferred into the at least single layer in process step C), and the second structure of the mask structure is transferred in the process D).

The first structure of the mask structure can be a rough structure which possesses relatively large areas by comparison to the second structure, which is a fine structure. The smallest area of the rough structure is preferably twice as large as the smallest area of the fine structure. Due to the isotropic structuring in process step C), this may lead to undercutting in the second fine structure of the mask structure, so that, for the most part, only the rough structure is transferred into the at least single layer (for example, see FIG. 1C). Therefore, the isotropic structuring in C) can work across the fine structure, so that there is complete etching below it, and it is therefore not transferred. Only in the anisotropic structuring step D), the second fine structure is then transferred into the at least single layer.

When a first and second layer is applied to the substrate, the rough structure is advantageously transferred into the second layer, and the fine structure is transferred into the first layer. The rough structure may, for instance, consist of a form for a bond pad with a determined geometric shape (such as round, triangular, polygonal), and the fine structure may, for instance, consist of line shaped structures for contact lines or fine conduit tracks.

If there is only one layer on the substrate instead of a first and second layer, areas of this layer which are adjacent to the rough mask structure can be removed using the isotropic structuring process in process step C), and only the rough structure of the mask structure is transferred into this layer. In process step D), the fine structure can then be transferred into areas of this layer which are farther away from the rough mask structure.

Furthermore, in the case of the presence of a first and second layer on the substrate, it is advantageous when, in process step C), a etching agent which is selective for the second layer is used, and if applicable, an etching agent which is selective for the first layer is used in process step D). In this manner, it is possible to guarantee that only the respectively desired layers are structured in process steps C) and D). The selection of the etching agents in these processes depends on the consistency of the first and second layers. If the first layer is a metal layer and the second layer is a dielectric layer, such as $SiO_2$, it is possible, for instance, to use an HF process in C) and a sputter process in D).

The first and second layers to be structured may, for instance, consist of metal layers. If the two structured layers are to be used for contacting an electrical component, it is particularly advantageous when the first layer is generated on the substrate as a platinum layer and the second layer is generated as a gold layer. Both metallic layers have particularly good electrical conductivity, wherein it is also particularly simple to apply, for instance, a wire for electrical contacting on the gold layer, using bonding processes such as ultrasound bonding.

In process step B) of the procedure as it is embodied in the invention, a photoresist layer is advantageously produced, and structured into a mask structure using photo-lithography (structuring by means of exposure and subsequent development). Structured photoresist layers are particularly suitable as mask structures in the process as per the invention. It is, however, also possible to generate mask structures in process step B) which cannot be photo structured. For example, it would be possible to generate a polymer layer on the second layer, for instance a polyimide layer, and then structure this layer into a mask by means of structured etching through a mask.

In an advantageous embodiment of the process as per the invention, the mask structure is lowered onto the first layer in areas in which the second layer below the mask structure was removed in a process step C1), which occurs according to C). Such an additional process step is shown, for instance, in FIG. 1D. It is possible as per the invention to use the isotropic structuring methods to undercut large areas of the mask structure by removing the second layer in process step C) (for example, see FIG. 1C). In this case, it is then particularly advantageous, in process step C), to lower the mask structure onto the first layer in order to then guarantee that the structure of the mask structure is transferred to the first layer with particular precision in process step D), using the anisotropic structuring method. Lowering the mask structure onto the first layer can, for instance, be accomplished by drying the mask structure or, in order to dry the mask structure, the entire arrangement of the substrate with the first and second layer and the mask structure is placed in a centrifuge, and is then centrifuged, wherein the mask structure dries and is simultaneously lowered onto the first layer.

Drying the mask structure is useful particularly when the structuring agents utilized in process step C), such as etching chemicals, are removed using a cleaning agent, such as water, and the remaining water is then to be removed.

In process step C), the second layer is preferably removed entirely except for one or several areas below the mask structure. Therefore, very large areas of the first layer are uncovered and are therefore particularly accessible to structuring in process step B).

Furthermore, in a process step E) subsequent to process step D), the mask structure can be removed. In this case, the mask structure is only required as a temporary structure for structuring the first and second layers or the single layer, and can then be removed again.

Preferably, the process as per the invention is modified to be used as a process for the production of an electrical component, particularly the electrical connections of the electrical component. Therein, in process step A), the substrate is provided with additional functional layers and in process step B), a mask structure with a geometrically formed flat area is generated as the first structure and based on this, linear structures are generated as the second structure. Such a mask is shown, for instance, in FIG. 1. Subsequently, in process step C), the second layer is structured into an area which is situated below the geometrically formed area of the mask structure, wherein a bond pad is formed (see, for instance, FIG. 1C and FIG. 2). Then, in process step D), the linear structures of the mask structure are transferred into the first layer, wherein contact lines are formed (for instance, see FIG. 1E). Herein, the bond pad has a shape which largely corresponds to the geometric form of the area of the mask structure. This means that in comparison to the geometric form of the area of the mask structure, the bond pad has additional recessed areas, and therefore, also a cross section which widens towards the substrate (for instance, see FIGS. 1C, 2 and 3). The recessed areas and the cross section which widens towards the substrate are to be traced back to the isotropic structuring process in C), which leads to the undercutting of the mask structure.

A process which is similar to this variant of the process as per the invention, with an additional process step C1), is schematically shown in its cross section in the FIGS. 1A to 1F. The geometrically formed area of the mask structure which forms a continuous layer area in the mask structure herein serves to structure the bond pad from the second layer. In this process, the geometric form of the area can be selected as desired. For instance, possible shapes include squares, as shown in FIG. 3, or oval, round, triangular or polygonal forms. It is furthermore possible that the geometric form of the area of the mask structure can also take any desired irregular form. In the isotropic structuring in process step C), the geometric form of the area of the mask structure is herein transferred into the second layer, wherein, due to the isotropic structuring process, this produces undercutting of the mask structure, so that the geometric form of the area of the mask structure is only roughly transferred into the second layer (for instance, see FIGS. 1C and 3). Depending on the isotropic etching medium utilized, the consistency of the second layer, and the duration of the etching process in process step C), this results in recessed areas in the form of the bond pad. This transfers, for instance, a round form of the area of the mask structure into the second layer in such a manner that the bond pad possesses a round form with additional recessed areas (see FIG. 2). Furthermore, the bond pad out of the second structured layer, due to the isotropic structuring process, possesses a cross section which widens towards the substrate, as also shown in FIG. 1C.

Therefore, using a variant of the procedure as per the invention, contact lines and bond pads for electrical components can be produced with particular simplicity, wherein the production by means of the procedure as per the invention can be recognized in the geometrics and the form of the bond pad (the bond pad possesses a geometric form of the area of the mask structure with additional recessed areas, and furthermore possesses a cross section which widens towards the substrate). The contact lines which are produced by means of this variant of the procedure as per the invention are in electrical contact with the bond pad and ensure that the electrical current can, for instance, be applied to the bond pad by means of a bonded wire, thereby acting evenly on the complete substrate or the functional layers applied thereon. The contact lines thereby distribute the current which is applied to the bond pad as evenly as possible across the functional layers of the component. Herein, the contact lines can assume highly varied forms as desired. For instance, they can be formed in grids (for example, see FIGS. 2 and 4). Furthermore, the contact lines can also be formed in rays and jagged as shown in FIG. 3.

It is also possible to use variants of the procedure as per the invention to produce active elements, such as electrically conducting structures of electrical components and their bond pads. For instance, the electrically conducting micro-structures (e.g. interdigital finger electrodes) of surface wave elements and bond pads which are in electrical contact therewith can be produced especially simply using variations of the procedure as per the invention. The electrically conducting microstructures of surface wave elements include, for instance, aluminum, while the bond pads which are in contact with them may, for instance, include gold.

The object of the invention furthermore includes an electrical component which includes a substrate with a first and second structure arranged thereon, wherein the first structure is structured using an isotropic structuring method, and the second structure using an anisotropic structuring process, out of at least one layer. Herein, due to the isotropic structuring method, the first structure shows a cross section which widens towards the substrate, as well as an irregular geometric form, which largely corresponds to the form of a mask structure which is utilized to generate this first structure, and which possesses additional recessed areas due to the isotropic structure. The first structure may, for instance, consist of a bond pad, and the second structure of contact lines, such as conduit tracks or a contact grate.

In customary elements, the bond pads generally have a certain geometric form, e.g. circular forms or squares, wherein there are no additional recessed areas and no cross section which widens towards the substrate. This is due to the fact that in customary production processes for electrical contacts, anisotropic structuring processes are used. These transfer the structures of the photoresist vertically into the layers which are being structured.

A component as per the invention has the advantage that it can be produced very simply. The geometric form of the bond pad can, for instance, be round, triangular or polygonal, or it may assume any desired irregular form.

The contact lines in such a component are advantageously grate-formed, so that the current which is applied to the bond pad can be distributed very evenly across the functional layer. The material of the second structure, from which the bond pad is normally structured, is preferably gold, while the material of the first layer, from which the contact lines are formed, may preferably consist of platinum.

The object of the invention furthermore includes an electrical component which includes a substrate with a first and second structure arranged thereon, wherein the first structure has a cross section which widens towards the substrate and a geometric form, whose circumference has additional recessed areas.

As discussed above, these recessed areas and the cross section which widens towards the substrate are due to the isotropic etching of this first structure.

Below, the invention will be explained in further detail, using embodiment samples and figures.

DETAILED DESCRIPTION

Figure 1A:
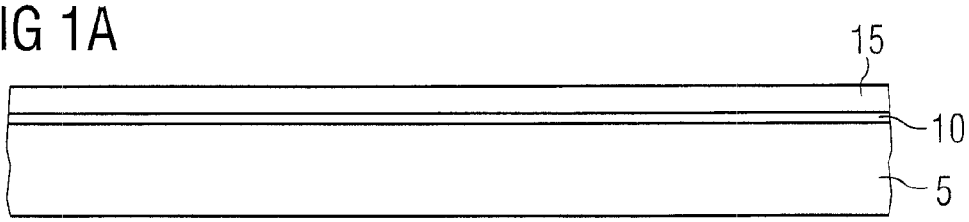
FIGS. 1A to 1F show a schematic cross section of a variant of the procedure as per the invention.

FIG. 1A shows a cross section of an arrangement consisting of a substrate 5 together with an first layer 10 and second layer 15 applied thereon, as in process step A) of the procedure as per the invention. If, for instance, electrical contacts in the form of contact lines and bond pads are to be built up for an electrical component, the first layer 10, for instance, can consist of platinum, and the second layer 15 can consist of gold. A13

Figure 1B:
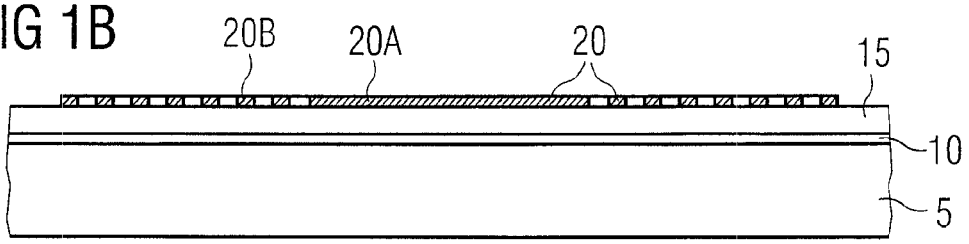

Subsequently, in process step B) as shown in FIG. 1B, a mask structure 20 is applied to the second layer 15. This mask structure 20 herein possesses a geometrically formed area 20A, below which the bond pad is formed. Furthermore, the mask structure 20 has linear structures 20B which originate from the area 20A, and which, in the event of contacts being produced, serve for structuring the later contact lines from the first layer 10. These linear structures of the mask structure 20 can be in the form of grates.

Figure 1C:
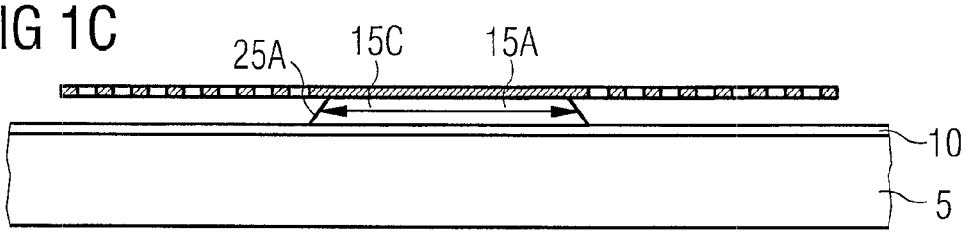

FIG. 1C shows how in process step C), the second layer 15 is structured by means of an isotropic structuring process through the mask structure 20, and in this process, the first layer 10 is partially uncovered. In this process step C), the second structured layer 15A is formed. It will later form a part of the bond pad. FIG. 1C shows that due to the isotropic structuring process, there is etching below the mask structure 20, so that the recessed areas 25A are formed in the second structured layer 15A. The consequence of this is that the cross section 15C of the second structured layer 15A widens towards the substrate 5. The isotropic structuring process, for instance isotropic etching, advantageously and as shown in FIG. 1C, removes large areas of the second layer 15 which are present below the smaller structures 20B of the mask structure 20, so that large areas of the mask structure 20 are completely undercut.

Figure 1D:
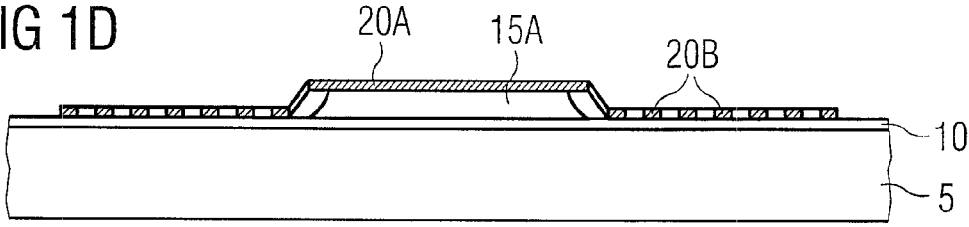

In a subsequent process step C1 which is shown here in FIG. 1D, those parts of the mask structure 20 which were undercut are lowered onto the first layer 10.

This can, for instance, be accomplished by drying the mask structure so that the watery cleaners which were used to flush out the corrosive medium which was utilized in process step C) are removed. The etching medium can, for instance, include wet chemical etching agents. For drying, the entire arrangement of the mask structure, both layers as well as the substrate, can be placed in a centrifuge device, wherein it is particularly advantageous to lower the undercut areas of the mask structure 20 onto the first layer 10 at the same time. Lowering the mask structure 20 onto the first layer 10 enables a particularly precise transfer of the structure of the mask structure onto the first layer 10 in the subsequent process step D).

Figure 1E:
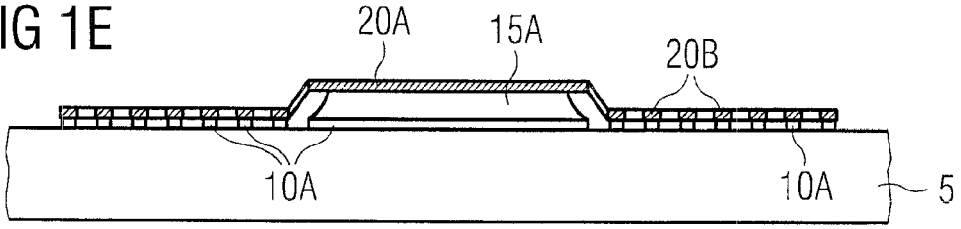

Subsequently, in process step D), the first layer 10 is structured through the mask structure 20, wherein the smaller structures 20B of the mask structure 20 are transferred into the first layer. In this process, the first structured layer 10A is formed (FIG. 1E). Herein, a contact grate is formed, as shown, for instance, in the top view in FIGS. 2A and 2B.

Figure 1F:
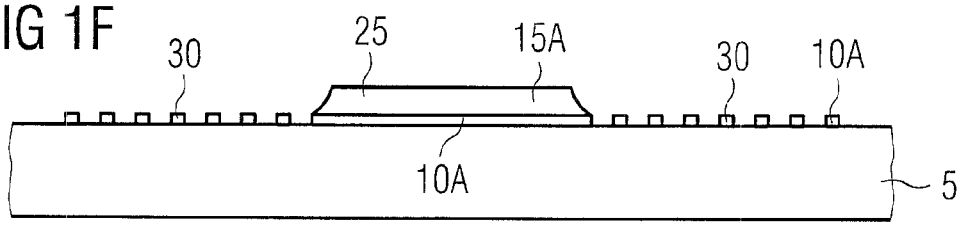

Following this, the mask structure 20 is removed in process step E), wherein the bond pad 25, consisting of the first and second structured layers 10A, 15A and additionally the contact lines 30, are uncovered (FIG. 1F). The bond pad 25 can, for instance, serve for electrical contacting of a component when a wire is bonded onto it.

Figure 2A:
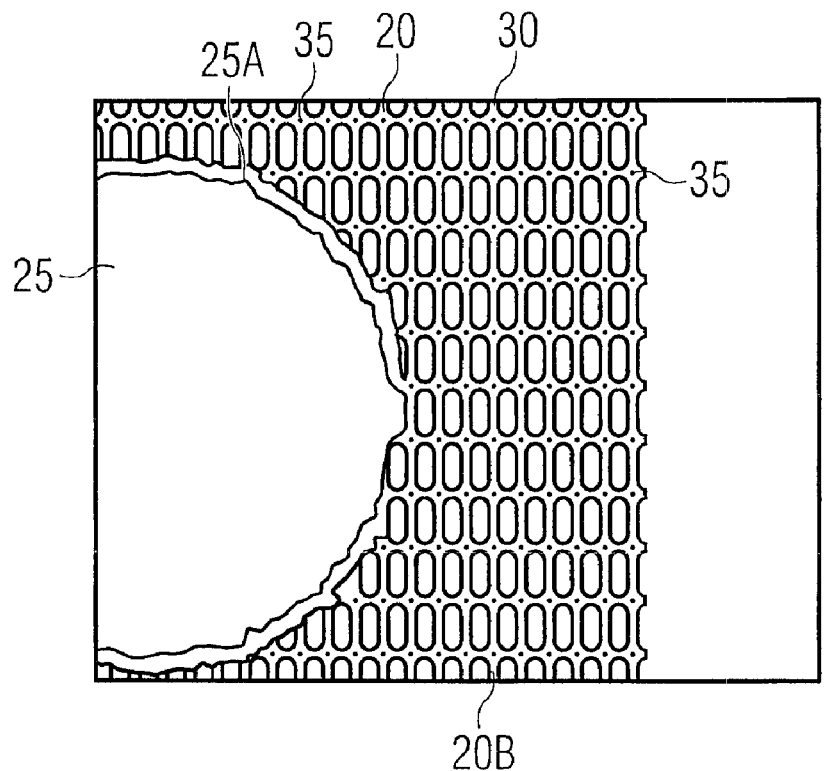
FIGS. 2A and 2B show a top view of enlargements of a bond pad during the isotropic structuring of the second layer in process step C).
Figure 2B:
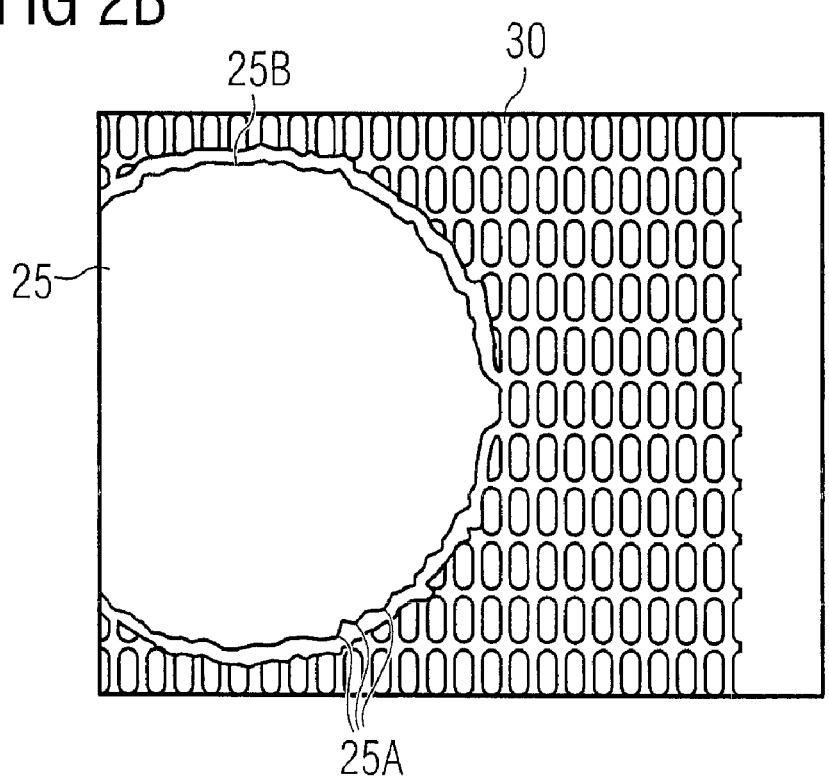

FIGS. 2A and 2B show the isotropic structuring of the second layer, a gold layer, through the mask structure 20. As shown in FIG. 2A, the grate-formed areas, the linear structures 20B of the mask structure, are herein undercut in the isotropic etching process, while in FIG. 2A, at the intersection points of the linear structures 20B, there are still remainders 35 of the second gold layer. Therefore, the undercutting process is not yet completed here. Furthermore, it is recognizable that due to the isotropic structuring, recessed areas 25A are formed in the bond pad, which is also due to undercutting of the mask structure. The original geometric form of the area of the mask structure is circular in this case, so that, due to this, a circular bond pad with additional recessed areas 25A results. In FIG. 2B, process step C) is completed. No areas 35 of the second gold layer below the intersection points of the line-formed structures 20B of the mask structure still remain.

Figure 3:
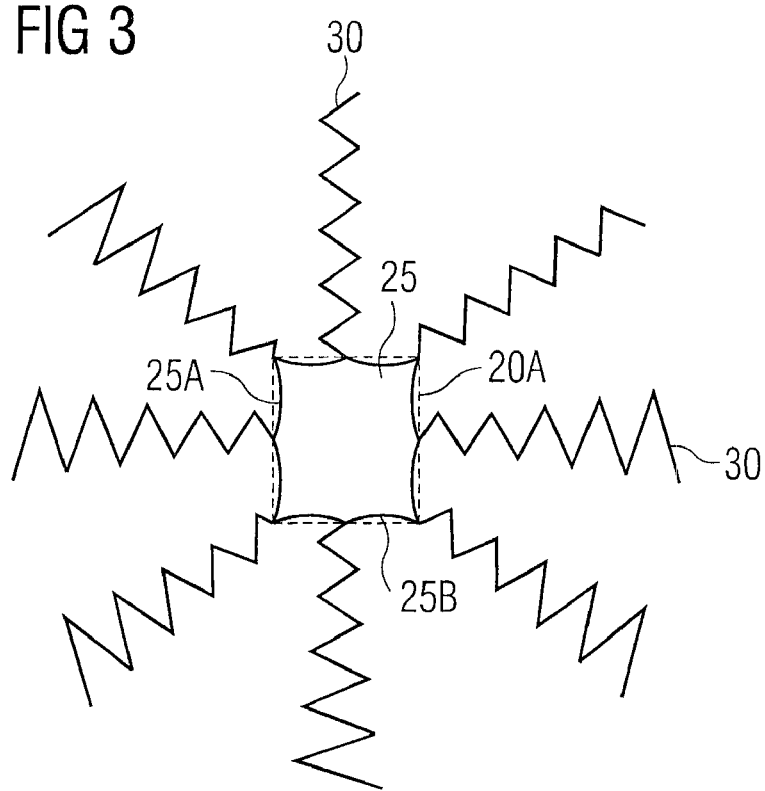
FIG. 3 shows an embodiment of a bond pad with contact lines.

FIG. 3 shows a top view of a further possible embodiment of a bond pad 25 with contact lines 30 in the form of jagged rays. The original geometric form of the area of the mask structure is indicated here in broken lines as form 20A. The original form was square in this case.

Process step C), due to the isotropic structuring, results in a form 25B, which, in addition to the square 20A, possesses recessed areas 25A. The ray-formed contact lines 30 herein represent a possible variation of the contact lines, which are frequently grate-formed.

Figure 4:
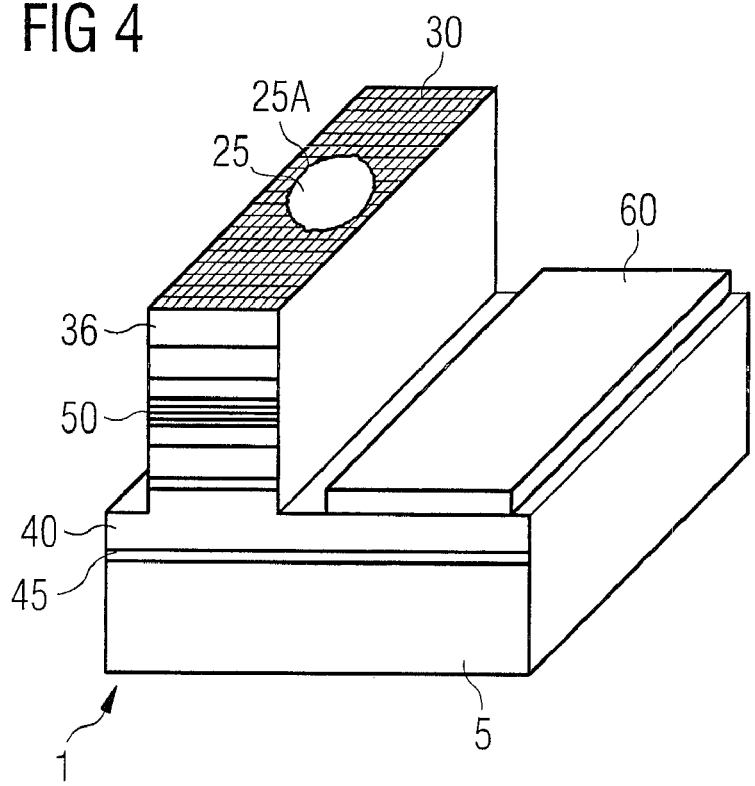
FIG. 4 shows a possible embodiment of an electrical component as per the invention.

FIG. 4 shows a schematic perspective view of a component as per the invention. In this case, the component is an InGaN-LED. Herein, various functional layers are applied onto a substrate 5, for instance a sapphire substrate. These layers may include, for instance, a GaN buffer layer 45, n-endowed gallium nitride 40, an InGaN multiquantum well 50 as well as P-gallium nitride 36. Furthermore, there are other additional gallium nitride layers which are endowed with various elements, such as aluminum or indium, which are not identified individually here. On the p-endowed gallium nitride layer, which frequently shows poor electrical conductivity, contacts are mounted. These can, for instance, be produced using the process as per the invention. Namely, the bond pad 25 with the—for instance—additionally present recessed areas 25A which result from production by means of the process as per the invention, as well as a contact grate 30 for better transmission of the electrical current onto the pre-endowed gallium nitride layer 36. Furthermore, there is also an n-electrode present on the n-endowed gallium nitride layer. The contacts as per the invention can herein also be mounted on the n-endowed gallium nitride layer.

SAMPLE EMBODIMENT

In process step A) of the process as per the invention, an InGaN-LED is vapor covered with a first layer of platinum with a thickness of 40 nm and then with a second layer of gold with a thickness of 1000 nm. Subsequently, the photoresist AZ 1505 (Clariant) is applied in a centrifuge process, and exposed for 2 seconds with a corresponding mask (bar width 2.5 μm and a central bond pad with a diameter of 120 μm). After this process, the exposed areas are developed with the developer AZ 351B, wherein the mask structure is formed. This is then dried for 30 minutes at 120° C. In process step C), the second layer, the gold layer, is then etched with an aqueous cyanide containing etching medium for gold, wherein follow-up etching takes place for 1½ minutes in order to obtain good undercutting of the mask structure. The etching medium is then removed by flushing with water, and drying takes place in the spin rinse dryer at a maximum of 2400 revolutions per minute, wherein the undercut areas of the mask structure are additionally lowered onto the first layer, the platinum layer. Herein, additional drying takes place subsequently at low revolutions in the spin rinse dryer with nitrogen flow. After this process, the platinum layer is etched for 6 minutes in argon plasma, using sputter etching (process step D)). Then the mask structure is removed in a post-strip process.

The present invention is not limited to the sample embodiments discussed here. Further variants are possible, for instance, with regard to the geometry of the bond pads, as well as the form and function of the contact lines.

What is claimed is:

1. A process for generating a structured component, comprising:
    forming a first layer on a substrate,
    forming a second layer on the first layer,
    generating on the second layer a mask with a first structure and second structure,
    performing an isotropic process on the second layer, which transfers the first structure into the second layer, and
    after performing the isotropic process, performing an anisotropic process on the first layer, which transfers the second structure into the first layer, wherein the first structure is different from the second structure.

2. The process of claim 1, wherein the first structure of the mask is a rough structure and the second structure of the mask is a fine structure, and the smallest expansion of the rough structure is at least twice as large as the smallest expansion of the fine structure.

3. The process of claim 1, wherein performing an isotropic process includes using an etching agent which is selective for the second layer.

4. The process of claim 1, wherein forming at least one of the first layer or the second layer includes forming a metal layer.

5. The process of claim 1, wherein the first layer is a Pt layer and the second layer is an Au layer.

6. The process of claim 1, wherein generating on the second layer a mask includes forming a photoresist layer and performing photolithography on the photoresist layer to form the mask.

7. The process of claim 1, wherein:
    performing the isotropic process removes the second layer below the mask, and
    the mask structure is lowered onto the first layer in areas in which the second layer beneath the mask is removed.

8. The process of claim 1:
    performing an isotropic process includes structuring the second layer with wet chemical isotropic etching, and
    performing an anisotropic process includes structuring the first layer with a dry anisotropic etching process.

9. The process of claim 1, wherein performing an isotropic process on the second layer removes the second layer entirely except for one or several areas below the mask.

10. The process of claim 1, wherein after performing the anisotropic process, the mask is removed.

11. The process of claim 1 wherein
    performing the isotropic process only transfers the first structure into the second layer, and
    performing the anisotropic process transfers the second structure into the first layer.

12. The process of claim 1, wherein forming the second layer includes forming the second layer of a material that is different than material of the first layer.

13. The process of claim 1, wherein performing the anisotropic process transfers the first structure into the first layer.

14. The process of claim 1, wherein:
    the first layer is formed on functional layers on the substrate,
    the first layer and second layer are metal layers,
    the first structure of the mask is a geometrically shaped area and the second structure is a linear structure that originates from the first structure,
    performing the isotropic process structures the second layer into an area which lies below the geometrically shaped area of the mask and forms a bond pad,
    performing the anisotropic process transfers the linear structure of the mask into the first layer, forming a contact line, and
    the bond pad has approximately a shape of the first structure and a cross section which widens towards the substrate.

15. The process of claim 14, wherein there are multiple linear structures and the linear structures of the mask are in grate arrangements.

16. An electrical component formed as a surface wave component, comprising:
a substrate, and
a first layer and a second layer on the substrate, wherein the first layer is different from the second layer, the second layer is structured into a first structure, the first layer is structured into a second structure and the first layer is between the second layer and the substrate;
wherein the first structure in the second layer is structured by an isotropic structuring process, the second structure is structured by an anisotropic structuring process and the first structure is different from the second structure, and
wherein the first layer and the second layer form electrical conductors of the electrical component, the first structure includes a bond pad and the second structure includes contact lines, the contact lines are electrically conducting microstructures and the substrate includes a piezoelectric crystal.

17. The electrical component of claim 16, wherein the contact lines are formed in a grate pattern.

18. The electrical component of claim 16, wherein:
the contact lines include a first electrically conducting metal, and
the bond pad includes the first electrically conducting metal and a second electrically conducting metal.

19. The electrical component of claim 18, wherein the first electrically conducting metal is Pt and the second electrically conducting metal is Au.

20. The component of claim 16, wherein the first layer includes the first structure.

* * * * *

UNITED STATES PATENT AND TRADEMARK OFFICE
CERTIFICATE OF CORRECTION

| | | |
|---|---|---|
| PATENT NO. | : 7,741,227 B2 | Page 1 of 1 |
| APPLICATION NO. | : 10/599949 | |
| DATED | : June 22, 2010 | |
| INVENTOR(S) | : Maja Hackenberger, Johannes Voelkl and Roland Zeisel | |

It is certified that error appears in the above-identified patent and that said Letters Patent is hereby corrected as shown below:

On the Title Page, Item (54), Title, delete "YEAR" and insert -- LAYER --.

Column 1, line 2, delete "YEAR" and insert -- LAYER --.

Signed and Sealed this

Fifth Day of October, 2010

David J. Kappos
*Director of the United States Patent and Trademark Office*